United States Patent [19]

Chinone et al.

[11] 4,315,226
[45] Feb. 9, 1982

[54] SEMICONDUCTOR LASER DEVICE

[75] Inventors: Naoki Chinone; Kazutoshi Saito, both of Hachioji; Noriyuki Shige, Takasaki; Ryoichi Ito, Hachioji, all of Japan

[73] Assignee: Hitachi, Ltd., Tokyo, Japan

[21] Appl. No.: 77,735

[22] Filed: Sep. 20, 1979

[30] Foreign Application Priority Data

Sep. 20, 1978 [JP] Japan .............................. 53-114676
Mar. 23, 1979 [JP] Japan .............................. 54-36822

[51] Int. Cl.$^3$ ............................................. H01S 3/19
[52] U.S. Cl. ....................................... 372/45; 357/17
[58] Field of Search ................ 331/94.5 H; 357/16-18

[56] References Cited

PUBLICATIONS

Kressel et al., "Low–Threshold LOC GaAs Injection Lasers", *Applied Physics Letters*, vol. 18, No. 2, Jan. 15, 1971, pp. 43–45.
Tsukada, "GaAs-Ga$_{1-x}$Al$_x$As Buried–Heterostructure Injection Lasers", *Journal of Applied Physics*, vol. 45, No. 11, Nov. 1974, pp. 4899–4906.
Pawlik et al., "Doppel-Hetero–Strukturkaser für Optische Nachrichtenübertragung", Siemens Forsch.-u. Entwickl.-Ber. Bd. 2(1973), pp. 210–217.
Thompson et al., "(GaAl)As Lasers With a Heterostructure for Optical Confinement and Additional Heterojunctions for Extreme Carrier Confinement", IEEE Journal of Quantum Electronics, vol. QE-9, No. 2, Feb. 1973, pp. 311–318.
Casey et al., "GaAs-Al$_x$Ga$_{1-x}$ As Heterostructure Laser with Separate Optical and Carrier Confinement", J. Appl. Phys., vol. 45, No. 1, Jan. 1974, pp. 322–333.
Cho et al., "Continuous Room-Temperature Operation of GaAs-Al$_x$Ga$_{1-x}$As Double-Heterostructure Lasers . . . ", App. Phys. Lett., vol. 28, No. 9, 1 May 1976, pp. 501–503.
Thompson et al., "Narrow-Beam Five-Layer (GaAl)As/GaAs Heterostructure Lasers . . . ", J. of Appl. Phys., vol. 47, No. 4, Apr. 1976, pp. 1501–1514.
Kajimura et al., "Leaky-Mode Buried-Heterostructure AlGaAs Injection Lasers", App. Phys. Lett., vol. 30, No. 11, June 1977, pp. 590–591.

*Primary Examiner*—James W. Davie
*Attorney, Agent, or Firm*—Craig and Antonelli

[57] ABSTRACT

A semiconductor laser device is capable of producing an increased optical output power with improved optical characteristics without being subjected to mode distortions in the output beam, while retaining advantageous features inherent to a semiconductor laser device of a buried heterostructure. The semiconductor laser device comprises an optical confinement region which is constituted by at least first, second, third and fourth semiconductor layers successively laminated on a predetermined semiconductor substrate. The second semiconductor layer has a relatively small refractive index and a relatively wide band gap as compared with those of the third semiconductor layer, while the first and the fourth semiconductor layers which are of the conductivity types opposite to each other have relatively small refractive indexes as compared with the second and the third semiconductor layers. The band gaps of the fourth and the second semiconductor layers are relatively large as compared with that of the third semiconductor layer. Difference in the band gap at least between the second and the third semiconductor layers is not smaller than 0.15 eV.

15 Claims, 19 Drawing Figures

SEMICONDUCTOR LASER DEVICE

The present invention relates to a semiconductor laser device which is capable of producing a high power output stably.

In the hitherto known semiconductor laser devices, there has been adopted a multi-layer structure for an optical confinement region which is essentially composed of three thin layers, that is, an active layer having a narrow band gap while exhibiting a high refractive index, and outer clad layers each having a large band width and a small refractive index and deposited at both sides of the active layer in a manner to sandwich the latter. Recently, it has been found that distribution of laser rays in the direction parallel to the active layer exerts significant influences to the oscillation characteristics of the laser device. It has become clear that a stripe width has to undergo some restriction in order to attain a stabilized laser ray distribution, which in turn means that the available laser output is necessarily reduced in correspondence with the narrowing of the stripe width because the maximum optical output available from a semiconductor laser is primarily determined by the density of light flux which may give rise to destruction at the outlet end face of the semiconductor laser device. On the other hand, as an approach for increasing the laser output, there has been proposed a Separate-Confinement-Heterostructure (SCH) in which the three-layer structure described above is provided at both sides with further thin layers to constitute a five-layer structure in an attempt to spread the laser ray distribution in the direction perpendicular to the plane of the active layer. Such a SCH structure is disclosed, for example, in "GaAs-$Al_xGa_{1-x}$ Heterostructure Laser with Separate Optical and Carrier Confinement", Journal of Applied Physics, vol. 45, No. 1, Jan. 1974, pp. 322–333 (by H. C. Casey). In this connection, it has however been found that at least difference in the forbidden gap between the active layer and a p-conductivity type layer adjacent to the active layer must be selected significantly large in order to confine the injected carriers within the active layer for a sufficiently long time. Thus, advantage expectedly brought about from the SCH structure is devaluated.

Further, there has been proposed a semiconductor laser device of a structure in which all the faces of the active layer having a large refractive index such as GaAs except for the face constituting a part of the optical resonator are capsulated by a mass of material such as GaAlAs exhibiting a refractive index lower than that of the active layer, as is disclosed in Japanese Patent Application Laid-Open No. 8471/1972 and in "Reduction of Threshold Current of Buried-Heterostructure Injection Lasers", Proceedings of the 7th Conference on Solid State Devices, Tokyo 1975, pp. 289–292 (by T. Tsukada et al.) for example. This structure is referred to as the semiconductor laser device of a buried heterostructure. This type laser device brings about many advantages. For example, (1) operating current may be reduced to the order of mA; (2) laser output is much stabilized in spite of variation in current; (3) no attenuation of laser output is experienced in modulation of extremely small signal up to the frequency of GHz order; (4) an improved response of optical output is attained for pulse currents; and (5) a light beam of an improved isotropy can be produced.

On the other hand, the semiconductor laser of the buried heterostructure suffers also from various drawbacks. For example, with the buried heterostructure, the width of the active layer must be restricted or narrowed to about 1 μm in order to stabilize the laser output. In contradiction, a maximum possible optical output which can be derived from the laser element depends on the geometrical factors or dimensions of the end face of the active layer at which the laser ray is emitted outwardly. As the geometrical dimensions in question are selected greater, the available optical output power becomes higher. Under the conditions, the maximum optical output power of the semiconductor laser device of the buried heterostructure has been at most about 7 mW. Because the semiconductor laser device will undergo destruction when operated at the maximum output power, it is in practice to operate usually the semiconductor laser device of the buried heterostructure at an optical output not higher than 1 mW. Thus, difficulty is encountered in applications of the semiconductor laser device of the buried heterostructure in respect that the laser output thereof is one third to one fifth or less of that of the other semiconductor laser devices of the stripe type in spite of many advantages of the buried heterostructure laser such as described above.

In order to increase the maximum possible optical output available from the laser device of the three-layer structure described hereinbefore, it is preferred that the geometrical dimension of the active layer be selected large. However, it should be mentioned that restriction is imposed to the increase or expansion in the geometrical dimension of the active layer. For example, when the active layer is implemented in thickness of 0.6 μm or more, high order modes will be likely to take place, while a threshold current for the laser oscillation will be significantly increased. For these reasons, the thickness of the active layer should preferably selected smaller than about 0.6 μm. Particularly preferable is to select the thickness of the active layer smaller than 0.15 μm, since then no increase will occur in the threshold current.

It has been further attempted to implement the active layer in a much reduced thickness to allow the light distribution to be spread out to the clad layers, thereby to reduce the ratio of radiation energy in the active layer. According to this approach, the intended effects become more significant, as the thickness of the active layer is more reduced. However, when the thickness of the active layer is reduced to 0.05 μm or less, appreciable unevenness or non-uniformity will unavoidably make appearance in the thickness of the active layer when formed through a present-day conventional crystal growth technique, involving difficulty in attaining the intended effect.

Accordingly, an object of the present invention is to provide a semiconductor laser device of a buried heterostructure which is capable of producing an increased output power without sacrificing the inherent advantageous features of this structure.

Another object of the present invention is to provide a semiconductor laser device which can exhibit excellent optical characteristics and is substantially insusceptible to mode distortion in the optical output.

Still another object of the invention is to provide a semiconductor laser device which is excellent in respect of high frequency modulation characteristic.

In view of the above and other objects which will become apparent as description procedes, it is proposed according to a general aspect of the invention that a semiconductor layer destined to serve as an optical guiding layer is incorporated adjacent to an active layer. Due to such structure implemented under specific conditions described hereinafter, the temperature depending behavior of the threshold current for the laser oscillation can be much stabilized, while the maximum possible optical output available from the laser device can be increased considerably. In FIG. 1, there is illustrated a basic distribution pattern of refractive index in a multi-layer structure of a semiconductor device according to the invention. It will be seen that there are deposited on a semiconductor substrate 10 at least a first clad layer 1, an optical guiding layer 2, an active layer 3 and a second clad layer 4 superposed in order to constitute a multi-layer structure. In general, the first and the second clad layers have conductivity types opposite to each other. The semiconductor substrate may be constituted by a plurality of semiconductor layers, if necessary. A further semiconductor layer may be deposited on the second clad layer, if desired. However, the fundamental optical confinement structure remains unaltered. As can be seen from FIG. 1, the refractive index $n_3$ of the active layer 3 and those ($n_1$ and $n_4$) of the clad layers 1 and 4 fulfill the condition: $n_3 > n_1$, $n_4$ as in the case of a hitherto known double-heterostructure. On the other hand, the refractive index $n_2$ of the optical guiding layer 2 is selected such that $n_3 > n_2 > n_1$, $n_4$. Due to the selection among the reflective indexes described above, laser light tends to be distributed in the active layer and the optical guiding layer, which makes it possible to obtain an increased laser output power. On the other hand, by selecting the band gaps $E_{g3}$, $E_{g1}$ and $E_{g2}$ of the active layer 3, the clad layer 1 and the optical guiding layer 2, respectively, such that $E_{g3} < E_{g1}$, $E_{g2}$, an adequate carrier confinement within the active layer can be accomplished. In this case, it is noted that the difference in the band gap between the optical guiding layer 2 and the active layer 3 should be greater than at least 0.15 eV. Otherwise, the temperature depending characteristic of the threshold current would become unfavorable for practical applications.

According to another feature of the invention, a semiconductor layer destined to serve as a burying layer and having a smaller refractive index while exhibiting a greater band gap may be additionally provided for the active layer at sides orthogonal to the propagating direction of the laser rays. This structure is effective for controlling the transverse mode in the direction parallel to the active layer. Usually, the whole multi-layer optical confinement structure on the substrate may be buried within the embedding layer.

Additionally, a thin carrier confinement layer may be provided between the active layer and the optical guiding layer.

The invention will now be described by way of example with reference to the accompanying drawings, in which.

Figure 1:
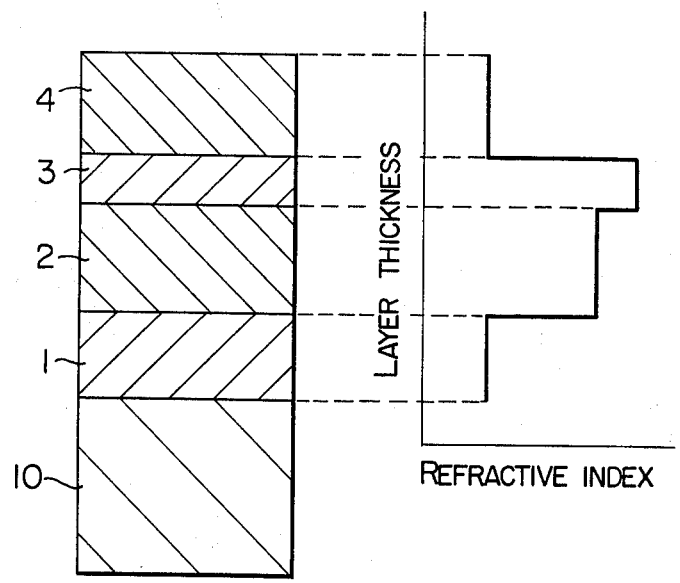
FIG. 1 is a schematic view to illustrate a fundamental structure of an optical confinement structure and a distribution of refractive indexes in a semiconductor laser device according to the invention.
Figure 8:
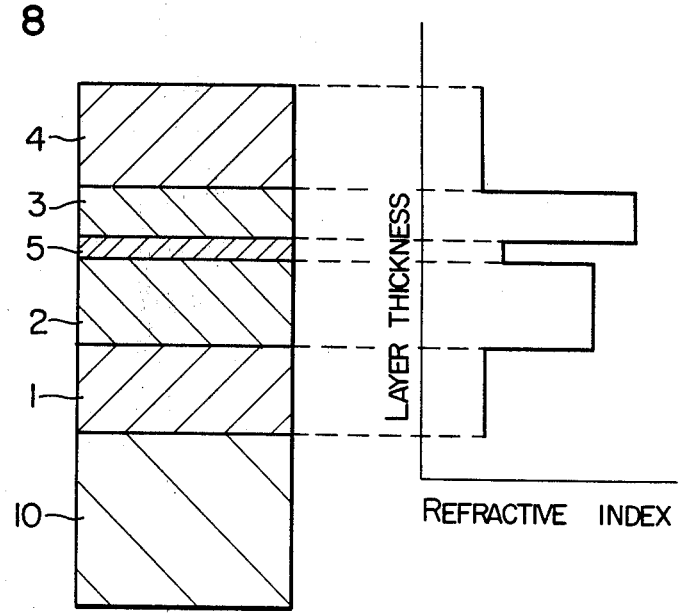
Figure 9:
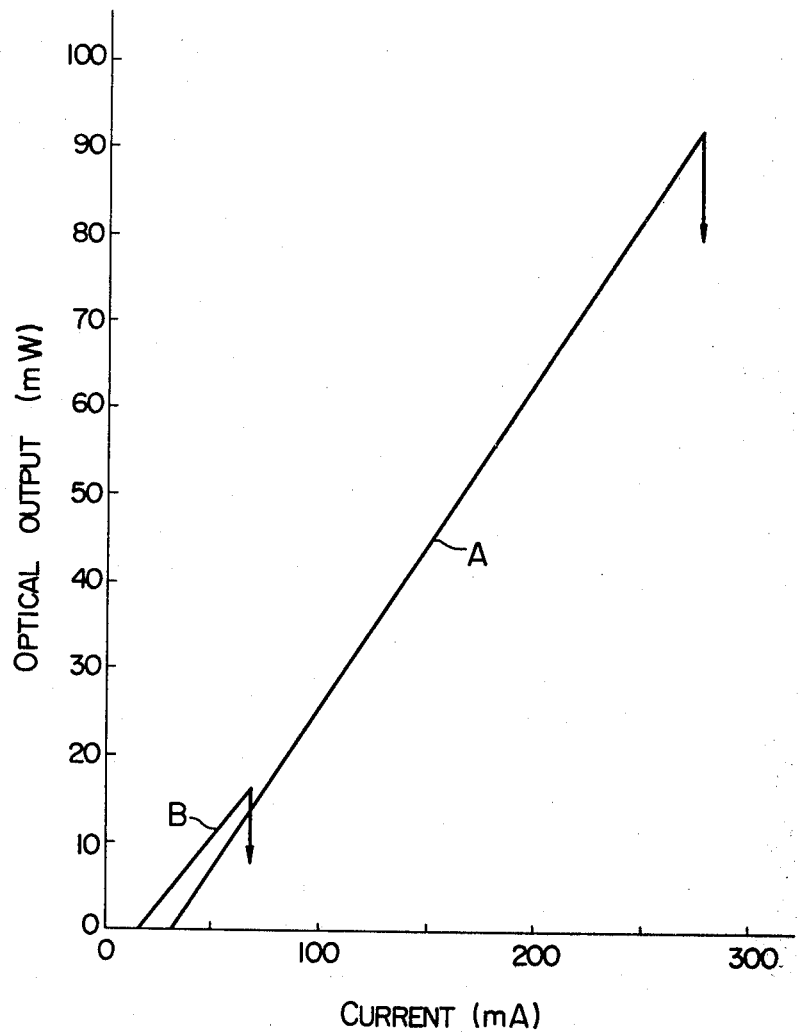
Figure 10:
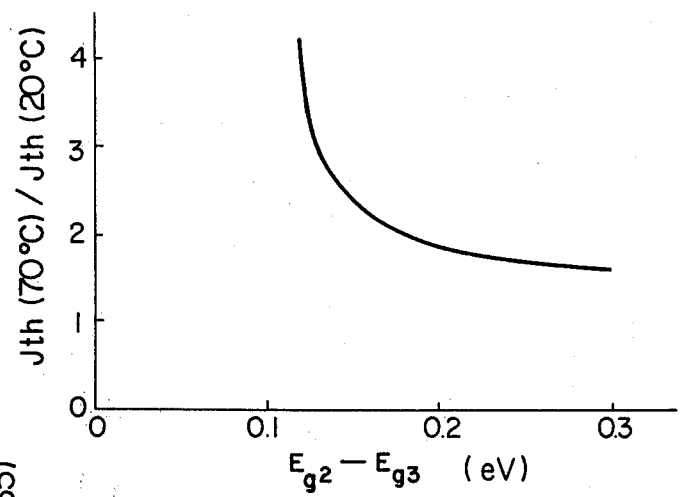
Figure 11:
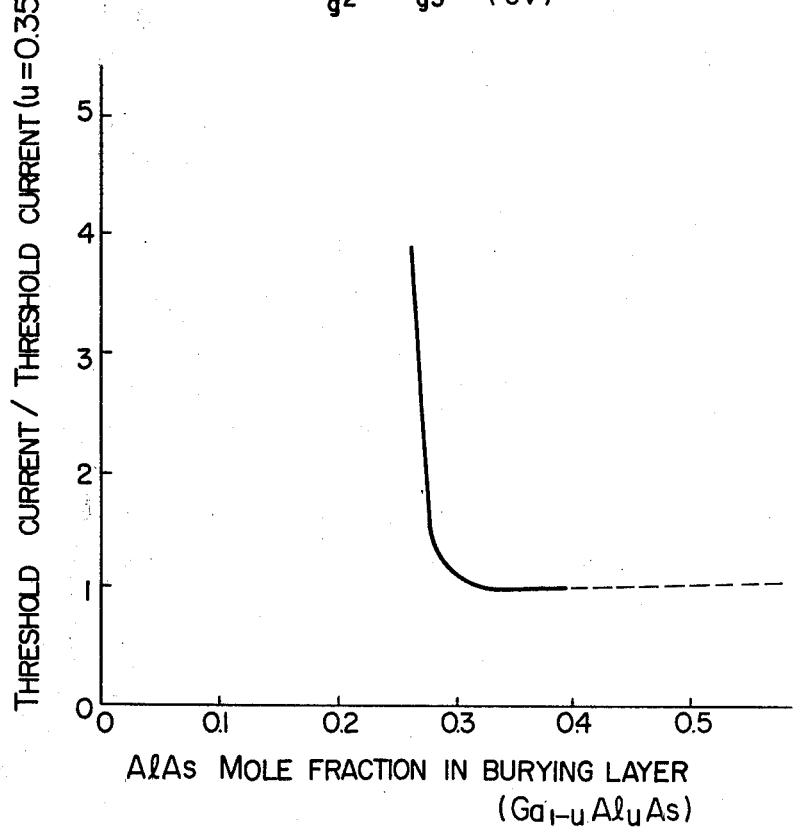
Figure 12:
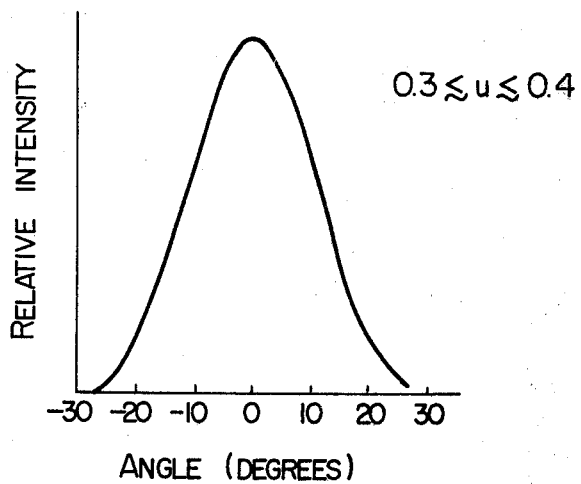
Figure 13:
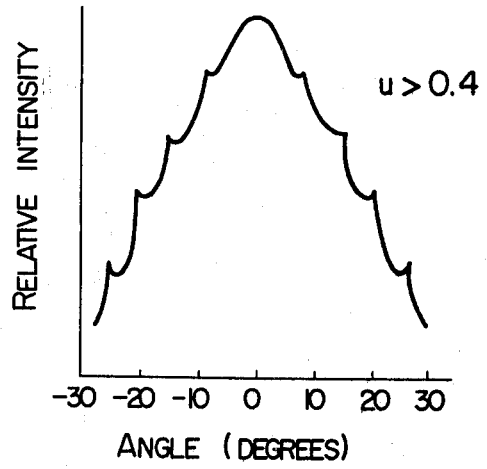
Figure 14:
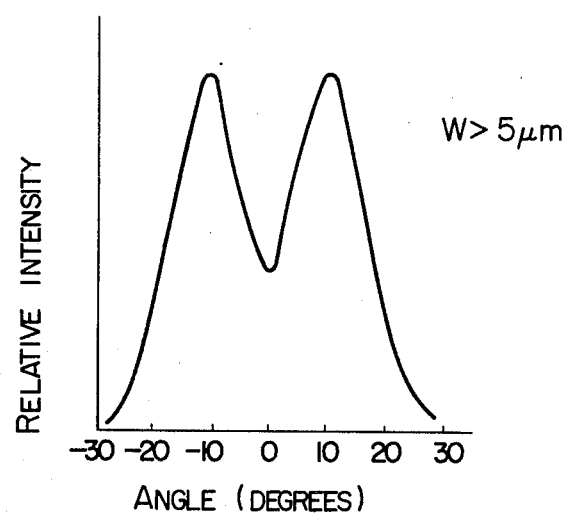
Figure 15:
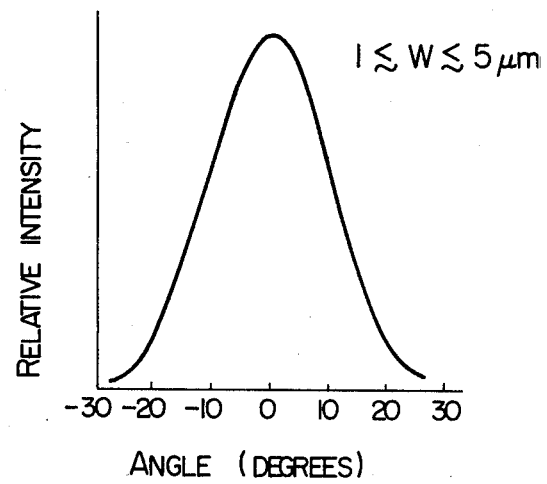
Figure 16:
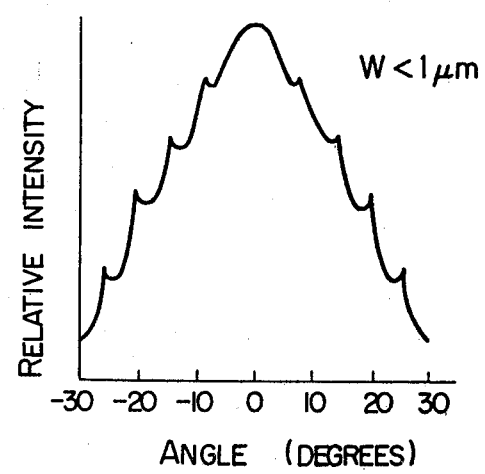
Figure 17:
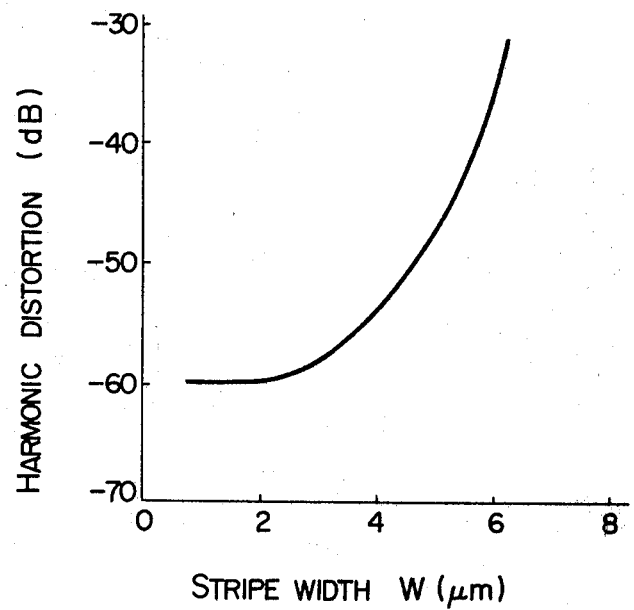
Figure 18:
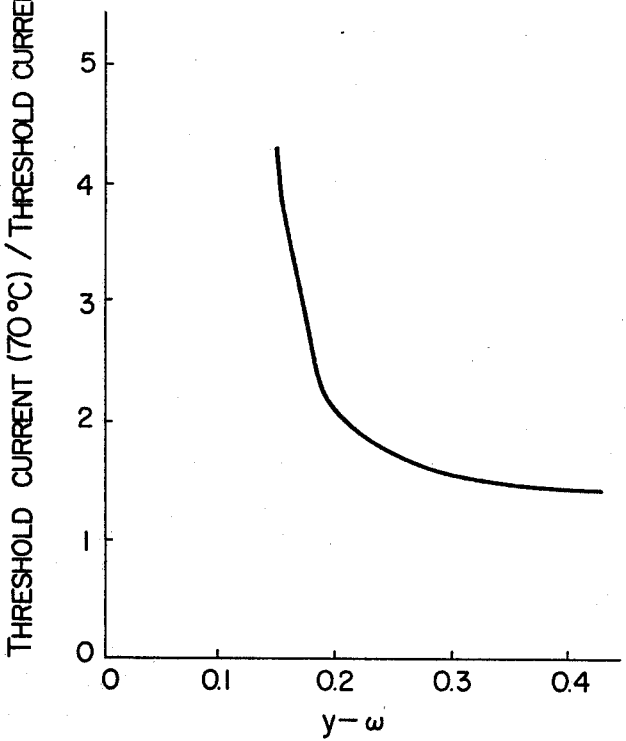
Figure 19:
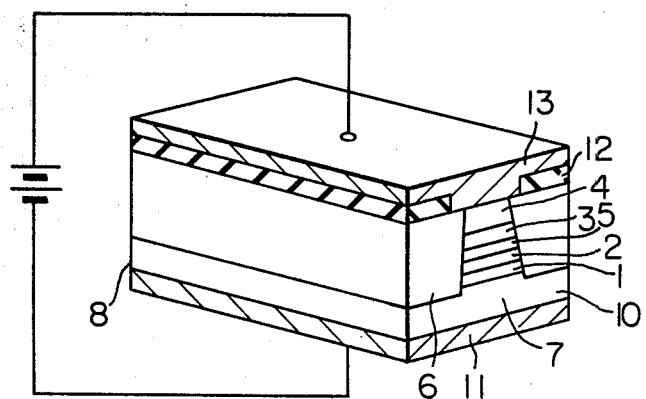

FIGS. 3 to 7 graphically illustrate relationships among refractive indexes $(n_2 - n_1)/(n_3 - n_1)$ to be established for providing an optical guiding layer as a function of the thickness of an active layer;

FIG. 8 is a similar view to FIG. 1 and illustrates another optical confinement structure together with an associated distribution of the refractive indexes in a semiconductor laser device according to another embodiment of the present invention;

FIG. 9 graphically illustrates relation between optical output and current in a semiconductor laser device according to the invention;

FIG. 10 graphically illustrates relationship between the difference in band gaps ($E_{g2} - E_{g3}$) and the temperature depending threshold current;

FIG. 11 graphically illustrates relationship between the threshold current (relative value) and the AlAs mole fraction u of a burying layer;

FIGS. 12 and 13 illustrate variations in a far-field pattern in dependence on AlAs-mole fraction of the burying layer;

FIGS. 14 to 16 illustrate variations in a far-field pattern as a function of stripe widths W;

FIG. 17 illustrates variation in harmonic distortion as a function of the stripe widths W;

FIG. 18 illustrates variation in the temperature dependence of the threshold current as a function of differences between AlAs-mole fractions of the second and the third layers; and FIG. 19 is a perspective view showing a semiconductor laser device according to another embodiment of the invention.

Now, the invention will be described in detail in conjunction with a typical semiconductor laser device of a GaAs-GaAlAs double heterostructure which is widely employed in practical applications at present.

Referring to FIG. 1 which is a perspective view showing a semiconductor laser device of GaAs-GaAlAs system, there are formed on a GaAs substrate 10 a clad layer 1 of n-$Ga_{1-x}Al_xAs$ where $0.2 \leq x \leq 0.6$, an optical guiding layer 2 of n-$Ga_{1-y}Al_yAs$ where $0.1 \leq y \leq 0.5$, an active layer 3 of $Ga_{1-\omega}Al_\omega As$ where $0 \leq \omega \leq 0.3$, and a second clad layer 4 of p-$Ga_{1-v}Al_vAs$ where $0.2 \leq v \leq 0.6$ in a multi-layer structure. Numeral 6 denotes a semiconductor layer of $Ga_{1-u}Al_uAs$ where $0.1 \leq u \leq 0.6$ which is to serve as a burying layer. Numerals 11 and 13 denote electrodes which may, respectively, be formed of alloys Au+AuGeNi and Cr+Au, by way of example.

The active layer 3 as well as the clad layers 1 and 4 may be implemented in a similar structure as in the case of the hitherto known double heterostructure. The thickness of the active layer 3 is generally selected from a range of 0.2 μm to 0.2 μm, while the thickness of the clad layers 1 and 4 are selected from a range of 0.3 μm to 2.5 μm. It should be mentioned that the influence of the thickness of the clad layers 1 and 4 to the characteristics of the semiconductor laser device is not so significant as the thicknesses of the active layer 3 and the optical guiding layer 2 described below. The refractive indexes $n_3$ and $n_1$ of the active layers 3 and the first clad layer 1 are selected such that the difference between these refractive indexes lies in a range of 0.18 to 0.22 for a practical purpose.

For implementing the optical guiding layer 2, it should be recalled that the difference in the band gap between the active layer 3 and the optical guiding layer 2 should not be smaller than 0.15 eV in order that the carriers are confined effectively within the active layer 3. The maximum value of the refractive index $n_2$ of the optical guiding layer 2 is determined in consideration of the restricting condition described above. Accordingly, a minimum value is simultaneously given for the mole fraction y of $Ga_{1-y}Al_yAs$. Under the practical condition that the difference $(n_3-n_1)$ be in the range of 0.18 to 0.22 as described above, the unequality condition $(n_2-n_1)/(n_3-n_1) \leq 0.6$ has to be fulfilled with an allowable tolerance. It is preferred that the difference in the band gap between the active layer 3 and the optical guiding layer 2 should be greater than 0.25 eV, inclusive. In this case, the condition $(n_2-n_1)/(n_3-n_1) \leq 0.4$ can be fulfilled within an allowable tolerance range.

In order to attain the envisaged effects ascribable to the provision of the optical guiding layer 2, it is important that the value of $(n_2-n_1)/(n_3-n_1)$ should be restricted to ranges defined above curves $a_1$, $a_2$, $a_3$, $a_4$ and $a_5$ shown in FIGS. 3 to 7. These figures show the ratios of $(n_2-n_1)/(n_3-n_1)$ for the thicknesses $d_2$ of the optical guiding layer 2 of 2.0 $\mu$m, 1.0 $\mu$m, 0.6 $\mu$m and 0.4 $\mu$m, respectively. It will be seen that too great difference selected between the refractive indexes $n_3$ and $n_2$ will result in substantially similar configuration as the structure in which no optical guiding layer such as the layer 2 is provided.

The relationships described above are demonstrated in Table 1 for an exemplary semiconductor laser device of GaAs-GaAlAs system. In this table, the minimum values as well as corresponding maximum values of the ratio $(n_2-n_1)/(n_3-n_1)$ which are required for attaining the effect ascribable to the provision of the optical guiding layer with the thickness $d_3$ and $d_2$ of the active layers and the optical layers, respectively, being used as parameters.

TABLE 1

| $d_2$ ($\mu$m) | $d_3$ ($\mu$m) | | |
|---|---|---|---|
| | 0.04 | 0.1 | 0.2 |
| 0.4 | 0.31 | 0.29 | 0.22 |
| | (0.037) | (0.11) | (0.45) |
| 1.0 | 0.29 | 0.26 | 0.18 |
| | (0.11) | (0.22) | (0.52) |
| 2.0 | 0.26 | 0.22 | — |
| | (0.23) | (0.37) | |

Note:
Parenthesized numerical values represent the minimum values of y, while the non-bracketed values represent the maximum values of $(n_2-n_1)/(n_3-n_1)$. Further, it has been assumed that x = 0.32 and $\omega$ = 0.05.

It can thus be seen that the optical guiding layer should be so implemented that the condition $(n_2-n_1)/(n_3-n_1) \leq 0.6$ is fulfulled and at the same time the ratio $(n_2-n_1)/(n_3-n_1)$ falls within the ranges indicated by hatched areas in FIGS. 3 to 7 in dependence on the thicknesses of the active layer and the optical guiding layer.

It is further found that the ranges indicated by crosshatched regions in FIGS. 3 to 7 are much preferred for implementing the optical guiding layer 2.

By the way, the region defined below a single-dotted broken line in each of FIGS. 3 to 7 represents the range in which difference $(y-\omega)$ is not smaller than 0.2, as will be described hereinafter.

For the active layer of thickness smaller than 0.02 $\mu$m, fabrication of the semiconductor layer becomes practically difficult. For the optical guiding layer having thicknesses other than those illustrated in FIGS. 3 to 7, the requisite conditions may be determined through appropriate interpolation.

In a preferred embodiment of the invention, the fourth layer 4 may be implemented with a desired stripe while the lateral sides orthogonal to the propagating direction of the radiated light are provided with burying semiconductor layers 6 with a view to stabilizing transverse mode. More specifically, in the case of the prior art three-layer double heterostructure comprising the active layer sandwiched between the outer clad layers, the effective refractive index of the active layer will vary considerably in dependence on the thickness of the active layer, even when the multi-layer heterostructure is realized in the buried heterostructure configuration. Consequently, the refractive index of the burying layer had to be selected considerably small in order to sustain a stabilized transverse mode. Therefore, in order to produce a stabilized oscillation in the fundamental mode, the stripe width must be smaller than about 1 $\mu$m, which in turn means that the available optical output of the laser device is necessarily restricted to 10 mW at maximum. In contrast, in the case of the semiconductor laser device according to the invention in which the optical guiding layer having a greater thickness than the active layer is additionally provided, the effective refractive index of the active layer is approximated to that of the optical guiding layer. Because the thickness of the active layer is small as compared with that of the optical guiding layer, the influence of the thickness of the optical guiding layer to the effective refractive index can be suppressed to a negligible minimum. The effective refractive index may be mathematically determined by using a model of a waveguide with the aid of Maxwell's equation. A general mathematical procedures to this end is disclosed in "Introduction to Optical Electronics" by Amnon Yarix (published in 1971 by Holt-Rinehant-Winston Inc.).

It can thus be appreciated that the oscillation mode can be easily controlled by approximating the refractive index of the burying layer to that of the optical guiding layer, whereby the stripe width determinant to the oscillation in the fundamental mode can be made relatively large. For example, the stripe width may be increased to a value in the range of 4 to 5 $\mu$m. Further, higher order mode oscillation in a vertical direction which might otherwise be produced by the optical guiding layer can be prevented from occurrence by selecting appropriately the refractive index of the burying layer, whereby the oscillation in the fundamental mode can be sustained also in the vertical direction with an enhanced stability. In application where the mode is not a matter in concern, a larger stripe width up to about 20 $\mu$m can be used.

In the foregoing, description has been made in conjunction with the provision of the optical guiding layer for increasing the optical output of the semiconductor laser device.

With the invention, it is further contemplated to improve the optical characteristic of the laser output and at the same time to attain an improvement in the harmonic distortion in the dynamic characteristic. To this end, following conditions have to be fulfilled;

(1) The stripe width (W) is selected from a range of 1 $\mu$m to 5 $\mu$m, and more preferably selected so as to be 1 $\mu$m $\leq$ W $\leq$ 3 $\mu$m in view of the intended harmonic distortion characteristics.

(2) Difference in terms of AlAs mole fraction between the burying semiconductor layer 6 of $Ga_{1-u}Al_uAs$ and the active layer 3 of $Ga_{1-\omega}Al_\omega As$, i.e. the difference $(u-\omega)$ is selected at a value in a range of 0.25 to 0.35. In the case of the active layer of GaAs, the AlAs mole fraction of the burying semiconductor layer should be $0.25 \leq u \leq 0.35$. In more general cases where $0.05 \leq \omega \leq 0.15$, it is preferred to be $0.3 \leq u \leq 0.4$. In this way, the threshold current can be prevented from being increased significantly.

(3) The difference $(y-\omega)$ in AlAs mole fraction between the active layer 3 of $Ga_{1-\omega}Al_\omega As$ and the optical guiding layer 2 of $Ga_{1-y}Al_yAs$ is selected not smaller than 0.2, to thereby prevent the threshold current from being increased significantly.

The advantageous actions and effects as brought about by the conditions described above will be elucidated hereinafter in conjunction with detailed description of Examples.

In a preferred embodiment of the semiconductor laser device according to the invention, the confinement structure for the radiated light and carriers may be implemented in a five-layer structure, whose refractive index distribution is such as shown in FIG. 8. This five-layer structure is improved over the four-layer structure described hereinbefore in that a sixth layer 5 destined to serve as a carrier confining layer is interposed between the active layer 3 and the optical guiding layer 2. In FIG. 8, the layers similar to those shown in FIG. 1 are denoted by the same reference numerals. It should be noted that the refractive index $n_5$ of the carrier confining layer 5 is selected so that $n_3 > n_2 > n_5$, while the band gap of the layer 5 is selected higher than that of the optical guiding layer 2. An advantage of this structure resides in that the refractive index of the optical guiding layer 2 serving for optical confinement can be increased to allow the optical distribution to be realized with a greater width. The carrier confining layer 5 having a larger band gap functions to prevent the difference in the band gap between the optical guiding layer and the active layer from being decreased. However, in order to assure an adequate optical spreading to the optical guiding layer 2 from the active layer 3, the thickness of the carrier confining layer 5 should be in a range of 0.04 μm to 0.5 μm. Of course, the maximum possible thickness of this layer 5 is determined in dependence on the thicknesses of the other individual layers. In the case of the semiconductor laser device of GaAlAs, the thickness of the carrier confining layer 5 should not preferably be larger than 0.3 μm.

Although the foregoing description has been made on the assumption that the semiconductor laser device is one of GaAs-GaAlAs double-heterostructure lasers, it is self-explanatory that the invention is never restricted to such particular material but can be equally applied to the devices of InP-InGaAsP system, InGaP-GaAlAs system, GaAlSb-GaAlSbAs system or the like.

EXAMPLE 1

Figure 2:
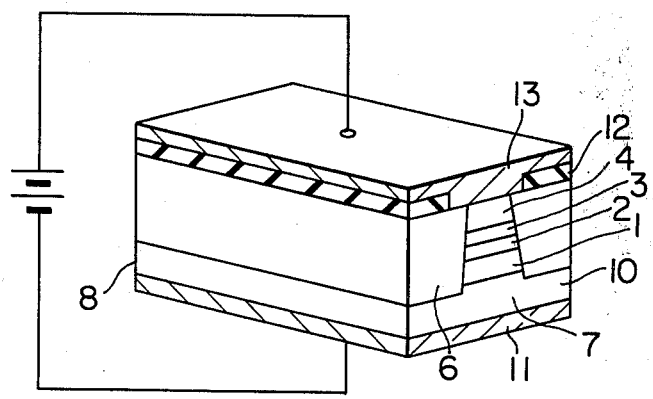
FIG. 2 is a perspective view showing a semiconductor laser device according to an embodiment of the invention.
Figure 3:
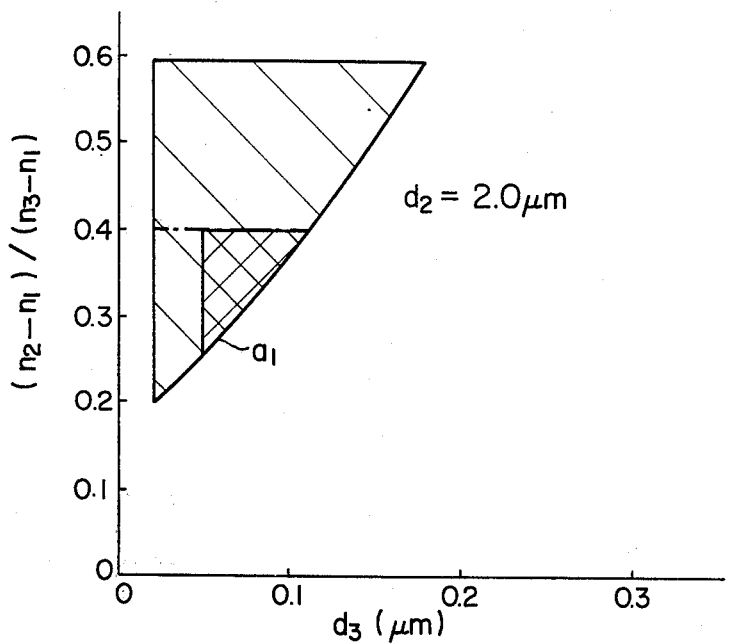
Figure 4:
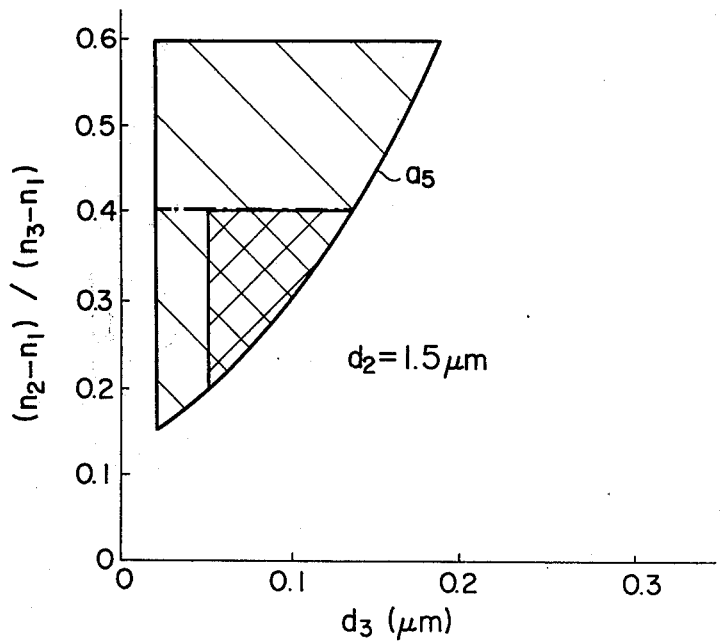
Figure 5:
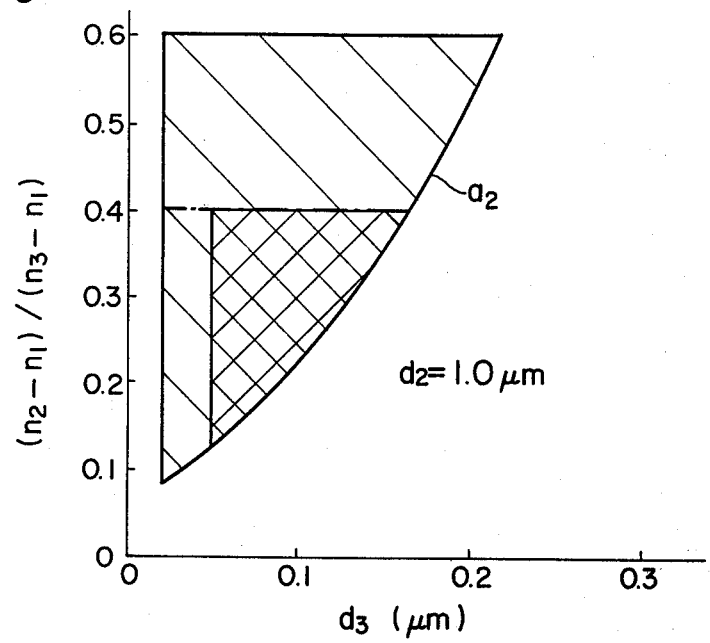
Figure 6:
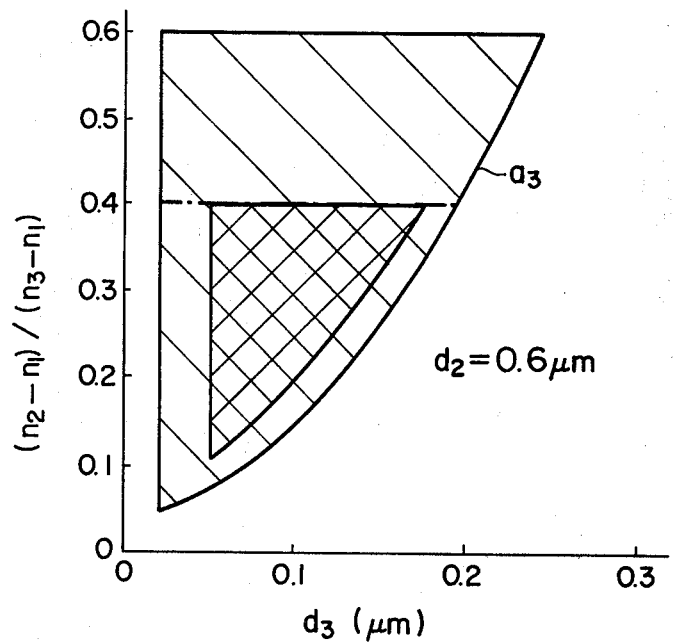
Figure 7:
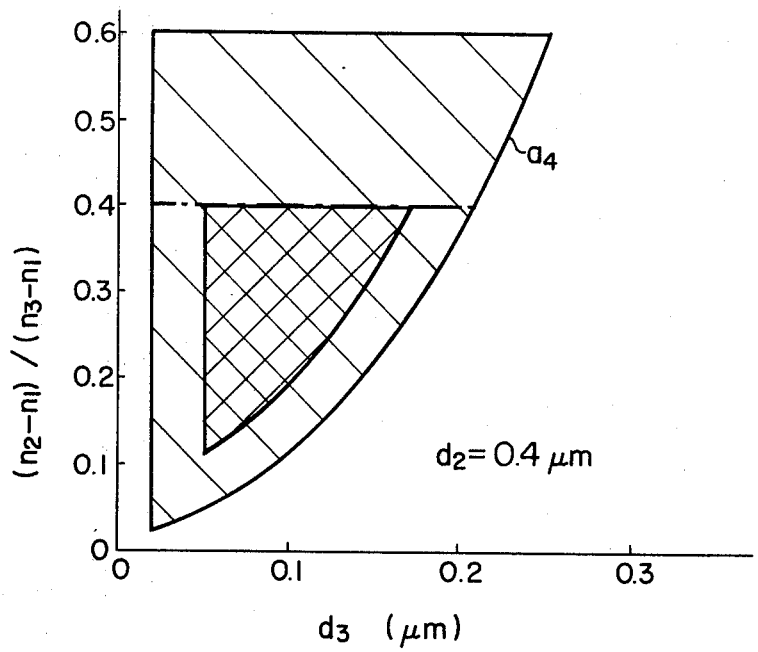

Referring to FIG. 2, there are formed on an N-type substrate 10 of GaAs an N-type layer 1 of $Ga_{1-x}Al_xAs$ ($0.2 \leq x3 \leq 0.6$) which is doped with Sn and exhibits a carrier concentration of $5 \times 10^{17}$ cm$^{-3}$, an N-type layer 2 of $Ga_{1-y}Al_yAs$ ($0.1 \leq y \leq 0.5$) which is doped with Sn and exhibits a carrier concentration of $5 \times 10^{17}$ cm$^{-3}$, an undoped layer 3 of $Ga_{1-\omega}Al_\omega As$ ($0 \leq \omega \leq 0.2$) exhibiting a carrier concentration of $1 \times 10^{17}$ cm$^{-3}$, and a P-type layer 4 of $Ga_{1-v}Al_vAs$ ($0.2 \leq v \leq 0.6$) which is doped with Ge and exhibits a carrier concentration of $1 \times 10^{18}$ cm$^{-3}$ in a continuously laminated structure through a liquid phase growing process known in the art. In order to meet the relationship concerning the refractive index among the individual layers described hereinbefore, it is established that $x > y$, $v > \omega$ and $v > y$.

Design data for the structures of semiconductor laser devices fabricated for testing are summed up in the following Table 2.

TABLE 2

| Sample No. | $Ga_{1-x}Al_xAs$ | | $Ga_{1-y}Al_yAs$ | | $Ga_{1-\omega}Al_\omega As$ | | $Ga_{1-v}Al_vAs$ | | $\frac{(n_2 - n_1)}{(n_3 - n_1)}$ | $Ga_{1-u}Al_uAs$ | |
|---|---|---|---|---|---|---|---|---|---|---|---|
| | x | Thickness | y | Thickness | ω | Thickness | v | Thickness | | u | Thickness |
| 1 | 0.32 | 2.0μm | 0.28 | 0.6μm | 0.05 | 0.05μm | 0.38 | 2.0μm | 0.26 | 0.36 | 4.6μm |
| 2 | 0.32 | 2.0 | 0.24 | 0.6 | 0.05 | 0.10 | 0.38 | 2.0 | 0.30 | 0.32 | 4.6 |
| 3 | 0.32 | 2.0 | 0.22 | 0.6 | 0.05 | 0.15 | 0.38 | 2.0 | 0.37 | 0.30 | 4.6 |
| 4 | 0.32 | 2.0 | 0.26 | 1.0 | 0.05 | 0.05 | 0.38 | 2.0 | 0.22 | 0.34 | 5.0 |
| 5 | 0.32 | 2.0 | 0.23 | 1.0 | 0.05 | 0.10 | 0.38 | 2.0 | 0.33 | 0.31 | 5.0 |
| 6 | 0.32 | 2.0 | 0.21 | 1.0 | 0.05 | 0.15 | 0.38 | 2.0 | 0.40 | 0.29 | 5.0 |
| 7 | 0.32 | 2.0 | 0.23 | 1.5 | 0.05 | 0.05 | 0.38 | 2.0 | 0.33 | 0.31 | 5.5 |
| 8 | 0.32 | 2.0 | 0.22 | 1.5 | 0.05 | 0.08 | 0.38 | 2.0 | 0.37 | 0.30 | 5.5 |
| 9 | 0.32 | 2.0 | 0.21 | 1.5 | 0.05 | 0.10 | 0.38 | 2.0 | 0.40 | 0.29 | 5.5 |

The requisite conditions for the refractive indexes described hereinbefore are fulfilled by selecting x at a value in a range of 0.2 to 0.4 for the semiconductor layer 1, selecting y at a value in a range of 0.1 to 0.3 for the semiconductor layer 2, selecting ω at a value in a range of 0 to 0.15 for the semiconductor layer 3 (the active layer) and selecting v at a value in a range of 0.2 to 0.4 for the semiconductor layer 4.

For completing a semiconductor laser device, a stripe-like mask is subsequently formed on the exposed surface of the semiconductor layer 4 with a stripe width of 3 μm. For forming the mask, a phosphosilicate glass (PSG) film is deposited on the surface of the layer 4, which film is then removed except for the region corresponding to the stripe to be formed through an etching process using a photoresist. The etching is effected by using an etching solution ($NH_4OH + H_2O_2 + H_2O$) until the surface of the semiconductor substrate 10 has been exposed. Next a layer of $Ga_{1-u}Al_uAs$ is grown through a well known liquid phase epitaxial process except for the mesa-like stripe portion. In order to confine the optical distribution within the stripe portion, u is selected so that $u > \omega$.

Next, a $SiO_2$ film 12 is formed in thickness of 3000 Å through CVD method. The region corresponding to a top portion of the multi-layer semiconductor structure is removed selectively in a stripe-like pattern having a width of 3 μm through a conventional photolithographic technique. Thereafter, an electrode 13 of Cr-Au is formed at the P-type layer while an electrode of Au+AuGeNi is formed on the N-type layer through physical evaporation. The reflecting mirrors extending in parallel to each other are formed at the opposite end faces 7 and 8 of the semiconductor device through cleavage. A semiconductor laser device has now been completed.

A semiconductor laser device thus fabricated has been operated continuously to measure an injection current vis-à-vis laser output power (mW) characteristic. Results are shown in FIG. 9, in which a curve A represents the concerned characteristic of the device having dimensions listed in the table 1, while a curve B represents a corresponding characteristic of the conventional buried heterostructure laser which incorporates no optical guiding layer such as the layer 2 according to the invention. Arrow-headed lines bent downwardly from the curves A and B represent occurrence of destruction in the associated semiconductor laser devices. As can be seen from FIG. 9, the semiconductor laser device according to the invention is capable of producing the optical output power quintuple as high as that of the conventional buried-heterostructure laser device.

FIG. 10 illustrates the temperature dependence of the threshold current (Jth) on the difference in band gap between the active layer 3 and the optical guiding layer 2, i.e. $E_{g2}-E_{g3}$. In this figure ratio of the threshold currents at 20° C. and 70° C. is taken along the ordinate. It will be seen that the temperature characteristic of the threshold current is excellently stabilized by selecting the difference ($E_{g2}-E_{g3}$) not smaller than 0.15 eV. More preferably, the band gap difference should be greater than 0.2 eV. The stabilization of temperature characteristic of the Jth is very important for practical applications.

In the following table 3, design data for multi-layer structures according to the invention in the cases where the stripe width is varied are summed up.

FIGS. 14 and 16 illustrate optical output characteristics of semiconductor laser devices according to the invention as a function of the stripe width.

When the stripe width is increased greater than 5 μm, higher order modes are likely to be produced, as shown in FIG. 14. On the other hand, when the stripe width is smaller than 1 μm, the optical output power is remarkably decreased, to thereby give rise to the appearance of mode distortions as is shown in FIG. 16. In contrast, when the stripe width is in the range of 1 μm to 5 μm, neither higher order modes nor mode distortion will make appearance.

FIG. 17 illustrates a harmonic distortion characteristic when modulated with a frequency of 100 MHz in 70% of the modulation index. In the case of the laser devices having a stripe width smaller than 3 μm, an improved linearity is obtained in the optical output vis-à-vis current characteristic. The harmonic distortion characteristic is obviously far excellent over that of the hitherto conventional semiconductor laser devices. The optical output power of the laser device having the stripe width of 3 μm is on the order of 60 mW, which means that the optical output power is enhanced by a factor of 10 as compared with that of the conventional buried heterostructure lasers. The laser devices according to the invention exhibit to be differential quantum efficiency in a range of 60 to 80%.

For the AlAs mole fractions y and ω for the layers 2 and 3, the condition that $y-\omega \geq 0.15$ and more preferably $y-\omega \geq 0.2$ should be fulfilled. Otherwise, the temperature dependency of the threshold current will become degraded, as is shown in FIG. 18.

EXAMPLE 2

TABLE 3

| Sample No. | $Ga_{1-x}Al_xAs$ x | Thickness | $Ga_{1-y}Al_yAs$ y | Thickness | $Ga_{1-\omega}Al_\omega As$ ω | Thickness | $Ga_{1-v}Al_vAs$ v | Thickness | $Ga_{1-u}Al_uAs$ u | Thickness | Width of stripe (μm) |
|---|---|---|---|---|---|---|---|---|---|---|---|
| 1 | 0.32 | 2.0 μm | 0.28 | 0.6 μm | 0.05 | 0.05 μm | 0.38 | 2.0 μm | 0.36 | 4.6 μm | 1 |
| 2 | 0.32 | 2.0 | 0.24 | 0.6 | 0.05 | 0.10 | 0.38 | 2.0 | 0.32 | 4.6 | 2 |
| 3 | 0.32 | 2.0 | 0.22 | 0.6 | 0.05 | 0.15 | 0.38 | 2.0 | 0.30 | 4.6 | 2 |
| 4 | 0.32 | 2.0 | 0.26 | 1.0 | 0.05 | 0.05 | 0.38 | 2.0 | 0.34 | 5.0 | 3 |
| 5 | 0.32 | 2.0 | 0.23 | 1.0 | 0.05 | 0.10 | 0.38 | 2.0 | 0.31 | 5.0 | 3 |

Consideration will be made on a semiconductor laser device listed in the above table 3 as a sample No. 1. In this case, since the mole fraction difference (u−ω) is in the range of 0.25 to 0.35, i.e. ω=0.05, leak current to the burying layer is increased when u becomes smaller than 0.3, involving the oscillation threshold current to be increased quintuple as high as the normal threshold current. Adverse influence is also exerted to the optical characteristics of the output laser beam. FIGS. 12 and 13 show far-field patterns parallel to the junction plane. More particularly, FIG. 12 shows the far-field pattern in the case where $0.3 \leq u \leq 0.4$, i.e. $0.25 \leq (u-\omega) \leq 0.35$, while FIG. 13 shows the far-field pattern in the case where $(u-\omega) > 0.35$. As can be seen from FIG. 13, when the difference (u−ω) is increased beyond 0.35, that is to say when u>0.4, the stripe width determinant to the fundamental mode is smaller than 1 μm, as the result of which the profile of the radiated beam is likely to become irregular due to roughness in the side walls of the stripe.

In the light of the above fact, the burying layer 6 should be implemented so that the difference (u−ω) be in the range of 0.25 to 0.35.

Referring to FIG. 19, there are formed on a N-type substrate 10 of GaAs an N-type layer 1 of $Ga_{1-x}Al_xAs$ ($0.2 \leq x \leq 0.6$) which is doped with Sn and has a carrier concentration of $5 \times 10^{17}$ cm$^{-3}$, an N-type layer 2 of $Ga_{1-y}Al_yAs$ ($0.1 \leq y \leq 0.5$) doped with Sn and exhibiting a carrier concentration of $5 \times 10^{17}$ cm$^{-3}$, an N-type layer 5 of $Ga_{1-z}Al_zAs$ ($0.1 \leq z \leq 0.5$) doped with Sn and having a carrier concentration of $5 \times 10^{17}$ cm$^{-3}$, an undoped layer 3 of $Ga_{1-\omega}Al_\omega As$ ($0 \leq \omega \leq 0.2$) having a concentration of $1 \times 10^{17}$ cm$^{-3}$, and a P-type layer 4 of $Ga_{1-v}Al_vAs$ ($0.2 \leq v \leq 0.6$) doped with Ge and exhibiting a carrier concentration of $1 \times 10^{18}$ cm$^{-3}$ in a continuously laminated structure through a known liquid phase growing process using a slide boat. In order to meet the conditions concerning the refractive indexes and the band gaps of the individual layers, selection is made such that x>y, z>y, z>ω, v>ω and that v>y. Design data for the semiconductor laser devices fabricated for testing are summed up in Table 4.

For completing the laser device, a stripe-like mask having a stripe width of 3 μm is formed on the exposed surface of the semiconductor layer 4 through a similar process as the one described in conjunction with the preceding Example 1. Next, by using an etching solution (NH$_4$OH+H$_2$O$_2$+H$_2$O), etching is effected until the surface of the semiconductor substrate 10 has been exposed. The stripe width is generally selected in a range of 1.0 μm to 5.0 μm as is in the case of the proceding Example 1. Except for a mesa-like stripe portion, a layer of Ga$_{1-u}$Al$_u$As is grown through a known liquid phase growing method. In order to allow the light distribution to be confined within the stripe region, it is established that u>ω.

Subsequently, a SiO$_2$ film 12 is formed in thickness of 3000 Å through CVD method. A region corresponding to a top portion of the multi-layer semiconductor structure is selectively removed in a stripe-like pattern of 3 μm in width through conventional photolithographic technique using a photoresist. Electrodes of Cr+Au and Au+AuGeNi are contacted to the P-type layer and the N-type layer, respectively, through a vacuum evaporation process. Finally, reflecting mirrors extending in parallel to each other are formed in the opposite end faces of the semiconductor laser structure through cleavage to complete the semiconductor laser device.

The laser devices thus fabricated exhibit the threshold current in a range of 10 mA to 40 mA, a maximum optical output power of 60 to 100 mW and a differential quantum efficiency of 40 to 70%.

Ga$_{1-\omega}$Al$_\omega$As where 0≦ω≦0.3, and said fourth semiconductor layer is formed of Ga$_{1-v}$Al$_v$As where 0.2≦v≦0.6.

4. In a semiconductor laser device according to claim 1, wherein said first semiconductor layer is formed of Ga$_{1-x}$Al$_x$As where 0.2≦x≦0.6, said second semiconductor layer is formed of Ga$_{1-y}$Al$_y$As where 0.1≦y≦0.5, said third semiconductor layer is formed of Ga$_{1-\omega}$Al$_\omega$As where 0≦ω≦0.3, said fourth semiconductor layer is formed of Ga$_{1-v}$Al$_v$As where 0.2≦v≦0.6, and said fifth semiconductor layer is formed of Ga$_{1-u}$Al$_u$As where 0.1≦u≦0.6.

5. In a semiconductor laser device according to claim 3 or 4, wherein a semiconductor layer assembly constituted by said first, second, third and fourth semiconductor layers has a stripe width of 1 μm to 5 μm, said third semiconductor layer has a thickness of 0.02 μm to 0.2 μm, difference in the AlAs mole fraction between said third semiconductor layer and said fifth semiconductor layer burying said semiconductor layer assembly at both side thereof is in a range of 0.25 to 0.35, and difference in AlAs mole fraction between said third semiconductor layer and said second semiconductor layer is not smaller than 0.2.

6. In a semiconductor laser device according to any one of claims 1, 2, 3 and 4, wherein a sixth semiconduc-

TABLE 4

| Sample No. | Ga$_{1-x}$Al$_x$As | | Ga$_{1-y}$Al$_y$As | | Ga$_{1-z}$Al$_z$As | | Ga$_{1-\omega}$Al$_\omega$As | | Ga$_{1-v}$Al$_v$As | | $\frac{(n_2 - n_1)}{(n_3 - n_1)}$ | Ga$_{1-u}$Al$_u$As | |
|---|---|---|---|---|---|---|---|---|---|---|---|---|---|
| | x | Thickness | y | Thickness | z | Thickness | ω | Thickness | v | Thickness | | u | Thickness |
| 1 | 0.32 | 2.0$^{\mu m}$ | 0.20 | 1.0$^{\mu m}$ | 0.28 | 0.2$^{\mu m}$ | 0.05 | 0.05$^{\mu m}$ | 0.38 | 2.0$^{\mu m}$ | 0.44 | 0.28 | 5.2$^{\mu m}$ |
| 2 | 0.32 | 2.0 | 0.15 | 1.0 | 0.28 | 0.2 | 0.05 | 0.10 | 0.38 | 2.0 | 0.63 | 0.23 | 5.2 |
| 3 | 0.32 | 2.0 | 0.15 | 1.0 | 0.32 | 0.2 | 0.05 | 0.05 | 0.38 | 2.0 | 0.63 | 0.23 | 5.2 |
| 4 | 0.32 | 2.0 | 0.10 | 1.0 | 0.32 | 0.2 | 0.05 | 0.10 | 0.38 | 2.0 | 0.81 | 0.18 | 5.2 |

What we claim is:

1. In a semiconductor laser device, an optical confinement region constituted by at least first, second, third and fourth semiconductor layers successively laminated on a predetermined semiconductor substrate, and a fifth semiconductor layer burying at least said second, third, and fourth semiconductor layers at each side face thereof which extends in parallel to the propagating direction of the laser ray, said second semiconductor layer having a relatively small refractive index as compared with that of said third semiconductor layer, said first and fourth semiconductor layers being of conductivity types opposite to each other and having relatively small refractive indexes as compared with that of said second and third semiconductor layers, said fourth and second semiconductor layers having respective band gaps which are relatively large as compared with that of said third semiconductor layer, and the fifth semiconductor layer having a smaller refractive index and a larger band gap than at least those of said third semiconductor layer, wherein difference in the band gap at least between said second semiconductor layer and said third semiconductor layer is selected not smaller than 0.15 eV.

2. In a semiconductor laser device according to claim 1, wherein said fifth semiconductor layer also buries said first semiconductor layer at side faces thereof extending in parallel to the propagating direction of laser ray.

3. In a semiconductor laser device according to claim 1, wherein said first semiconductor layer is formed of Ga$_{1-x}$Al$_x$As where 0.2≦x≦0.6, said second semiconductor layer is formed of Ga$_{1-y}$Al$_y$As where 0.1≦y≦0.5, said third semiconductor layer is formed of tor layer is interposed between said second semiconductor layer and said third semiconductor layer, the band gap of said sixth semiconductor layer being larger than those of said second and third semiconductor layers, and difference in band gap between said third semiconductor layer and said sixth semiconductor layer is not smaller than 0.15 eV.

7. In a semiconductor laser device according to claim 6, wherein said sixth semiconductor layer has a thickness not greater than 0.3 μm.

8. In a semiconductor laser device according to claim 1, wherein the difference in the band gap at least between said second semiconductor layer and said third semiconductor layer is not smaller than 0.25 eV.

9. In a semiconductor laser device according to claim 6, wherein the refractive index of said sixth semiconductor layer is relatively small as compared with the refractive index of said second semiconductor layer.

10. In a semiconductor laser device according to claim 3 or 4, wherein x>y.

11. In a semiconductor laser device according to claim 10, wherein v>w.

12. In a semiconductor laser device according to claim 11, wherein v>y.

13. In a semiconductor laser device according to claim 1, 2, 3, 4, or 8, wherein said second semiconductor layer has a thickness of 0.4 μm–2.0 μm.

14. In a semiconductor laser device according to claim 5, wherein said second semiconductor layer has a thickness of 0.4 μm–2.0 μm.

15. In a semiconductor laser device according to claim 6, wherein said second semiconductor layer has a thickness of 0.4 μm–2.0 μm.

* * * * *